United States Patent
Li

(10) Patent No.: US 8,630,108 B2
(45) Date of Patent: Jan. 14, 2014

(54) MOSFET FUSE AND ARRAY ELEMENT

(75) Inventor: Yan-Zun Li, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 13/076,489

(22) Filed: Mar. 31, 2011

(65) Prior Publication Data

US 2012/0250389 A1    Oct. 4, 2012

(51) Int. Cl.
*G11C 17/00* (2006.01)

(52) U.S. Cl.
USPC .................. 365/104; 365/185.14; 365/185.01; 365/225.7

(58) Field of Classification Search
USPC ...................... 365/104, 185.14, 185.01, 225.7
See application file for complete search history.

(56) References Cited

U.S. PATENT DOCUMENTS

| | | | |
|---|---|---|---|
| 6,261,937 B1 | 7/2001 | Tobben et al. | |
| 6,518,614 B1 | 2/2003 | Breitwisch et al. | |
| 7,254,078 B1 * | 8/2007 | Park et al. | 365/225.7 |
| 7,271,643 B2 | 9/2007 | Robinson et al. | |
| 7,272,067 B1 | 9/2007 | Huang et al. | |
| 7,531,886 B2 | 5/2009 | Chakravarti et al. | |
| 7,706,202 B2 | 4/2010 | Obayashi et al. | |
| 8,050,077 B2 * | 11/2011 | Li et al. | 365/104 |
| 2007/0183181 A1 | 8/2007 | Peng et al. | |
| 2007/0258311 A1 | 11/2007 | Kushida | |
| 2009/0027969 A1 | 1/2009 | Orban et al. | |
| 2010/0080035 A1 | 4/2010 | Venkatraman et al. | |

* cited by examiner

*Primary Examiner* — Toan Le
(74) *Attorney, Agent, or Firm* — Cantor Colburn LLP; Katherine Brown

(57) ABSTRACT

An alternative electrical fuse structure, which may be similar to or identical with an insulated gate field effect transistor ("IGFET") of advanced CMOS technology, can be very area efficient and programmable at relatively low voltages, e.g., programming voltages between 1.5 V and 2.5 V. A method is provided for programming an electrical fuse having the structure of an IGFET to permanently electrically isolate the drain of the IGFET from its source. In this way, the step of programming the IGFET fuse can increase a resistance between the source and the drain of the IGFET from a pre-programming value to a post-programming value by two or more orders of magnitude when any given gate-source voltage value and any given drain-source voltage value within normal operational ranges of the IGFET are applied thereto.

20 Claims, 4 Drawing Sheets

MOSFET FUSE AND ARRAY ELEMENT

BACKGROUND

1. Field of the Invention

The subject matter of the present application relates to electrical fuses, and more specifically to a fuse structure, circuit, and method of programming an electrical fuse having a structure similar to or the same as a MOSFET of an integrated circuit, particularly a MOSFET according to advanced CMOS technology.

2. Description of the Related Art

Fuses have been widely used in integrated circuits to store permanent information on board such as the Electronic Chip Identification (ECID), key system boot code and other critical information in the form of One-Time Programmable Read Only Memory (OTPROM). They are also widely used for redundancy repairs in memories and various integrated circuits to improve manufacturing yield or circuit trimming to fine tune device performance in analog products.

Various types of electrically-blowable fuses have been proposed and used in microelectronic elements, i.e., semiconductor wafers, or portions thereof such as semiconductor chips incorporating integrated circuits. Such fuses are programmed, i.e., blown, from a conductive state to a nonconductive state by driving a programming current through a metal feature which is the fusible element of the fuse that is typically a metallic silicide such as TiSi, CoSi, NiSi, etc. During programming, the current flowing through the metal fusible element of the fuse heats the fusible element either very fast to a critical temperature at which it violently melts or vaporizes (rupture), or through a slower controlled electromigration (EM) process to move metal elements downstream in a direction of movement of electrons therein, and thus create a physical gap in the fusible element, e.g., a discontinuity of the conducting metallic silicide. Whether rupture or EM is the dominant mechanism, the fusible element breaks into two electrically isolated parts, leaving the fusible element in a state much less conductive than before applying the excessive current.

While these types of fuse are ubiquitous today in every imaginable electronic product or equipment, there are limitations to their application under many circumstances. For example, the large size of the fuse itself and support circuitry and its relative high cost can limit the number of fuses used in a given product. The availability of a fuse structure that will work in a given process technology is not always guaranteed. As a result, each process technology can require additional process complexity and costs to establish an adequate fuse solution.

Further improvements can be made to the structure and operation of fuses to be incorporated in integrated circuit devices such as semiconductor chips.

SUMMARY OF THE INVENTION

An alternative electrical fuse is provided which can have an internal structure which is similar to or identical with the structure of a device, e.g., a metal-oxide-semiconductor field effect transistor ("MOSFET") or insulated gate field effect transistor ("IGFET") embodied in the same semiconductor chip. Such fuse structure, which may be identical with that of a transistor of an advanced CMOS (complementary metal-oxide-semiconductor) technology, can benefit from being very area efficient and being programmable at relatively low voltages, e.g., from between 1.5 V and 2.5 V. Embodiments herein provide a method of programming the fuse, an interconnection of the fuse in a circuit, and the usability of the fuse as a data storage element in a memory array.

Thus, an aspect of the invention provides a method for operating an insulated gate field effect transistor ("IGFET"). In such aspect, the IGFET is programmed to permanently electrically isolate the drain of the IGFET from the source of the IGFET. In this way, as a result of the programming, a resistance between the source and the drain can increase from a pre-programming value to a post-programming value by two or more orders of magnitude when any given gate-source voltage value and any given drain-source voltage value within normal operational ranges of the IGFET are applied thereto. In an example, the normal operating ranges for gate-source voltage and the drain-source voltage are 0.0 to 1.5 V.

In one example, the IGET can be an n-channel type field effect transistor ("NFET") and be embodied in a semiconductor chip having complementary metal-oxide-semiconductor ("CMOS") devices thereon.

In one example, the step of programming the IGFET may include overdriving the gate-source voltage and drain-source voltage of the IGFET. In a particular embodiment, the step of programming the IGFET may include applying a drain-source voltage and a gate-source voltage at magnitudes equal to or greater than 1.5 times nominal levels for operating the IGFET in the first conducting state.

In an example of the method, magnitudes of the nominal voltage levels for operating the IGFET in the first conducting state can be less than or equal to 1.0, and the magnitudes of the programming levels for programming the IGFET can be greater than or equal to 1.5.

In one example, the resistance between the source and drain before and after programming may increase by five or more orders of magnitude.

In a particular example, the step of programming the IGFET may include applying the gate-source voltage to the IGFET at a programming level having a magnitude equal to or greater than 1.5 times the nominal level for operating the IGFET in the first conducting state while applying the drain-source voltage to the IGFET at a programming level having a magnitude equal to or greater than 1.5 times the nominal level for operating the IGFET in the first conducting state. In a particular example, the step of programming the IGFET can include applying the drain-source voltage and the gate-source voltage to the IGFET at the respective programming levels for 10 to 500 milliseconds.

In one example, the step of programming the IGFET may also include applying an initial bias-induced temperature instability stress. In a particular example, the IGFET can be an n-type field effect transistor ("NFET") and the step of programming the IGFET can include applying negative bias temperature instability stress to the NFET. In another example, the IGFET can be a p-type field effect transistor ("PFET") and the step of programming the IGFET can include applying positive bias temperature instability stress to the PFET.

In one example, the IGFET can be a first IGFET and a second IGFET has one of a source or a drain electrically connected to one of the source or the drain of the first IGFET, wherein another one of the source or the drain of the first IGFET can be electrically connected with the gate of the first IGFET. According to such example, the step of programming may be performed by applying a first voltage simultaneously to the drain and the gate of the first IGFET.

In another example, the IGFET can be a first IGFET and a second IGFET can have a source or a drain electrically connected to one of the source or the drain of the first IGFET. In such arrangement, the step of programming can be performed by applying a first voltage to the drain of the first IGFET and applying a second voltage to the gate of the first IGFET.

Another aspect of the invention provides a method of operating a "write once read many" memory cell of an integrated circuit memory array having first and second binary states. In such method, an insulated gate field effect transistor ("IGFET") of a memory cell of the memory array can be programmed so as to permanently electrically isolate the drain of the IGFET from the source of the IGFET and permanently alter the IGFET from a first conducting state to a second nonconducting state. In such method, a resistance between the source and the drain can increase from a pre-programming value to a post-programming value by two or more orders of magnitude when any given gate-source voltage value and any given drain-source voltage value within normal operational ranges of the IGFET are applied thereto. In such method, the first and second states of the IGFET may represent the first and second binary states of the memory cell.

In one example, the IGET can be an n-channel type field effect transistor ("NFET") and be embodied in a semiconductor chip having complementary metal-oxide-semiconductor ("CMOS") devices thereon.

In a particular embodiment, the step of programming the IGFET may include overdriving the gate-source voltage and drain-source voltage of the IGFET.

In a particular embodiment, the step of programming the IGFET may include applying the gate-source voltage to the IGFET at a programming level having a magnitude equal to or greater than 1.5 times the magnitude of a nominal voltage level for operating the IGFET in the first conducting state. This programming condition may be applied while also applying the drain-source voltage to the IGFET at a programming level having a magnitude equal to or greater than 1.5 times the magnitude of the nominal level for operating the IGFET in the first conducting state.

In a particular embodiment, the IGFET can be a first IGFET and a second IGFET can have one of a source or a drain electrically connected to one of the source or the drain of the first IGFET. Another one of the source or the drain of the first IGFET can be electrically connected with the gate of the first IGFET. In such case, the step of programming can be performed by applying a first voltage simultaneously to the drain and the gate of the first IGFET.

In a particular example, in the first conducting state, the magnitudes of the nominal voltages for operating the IGFET may be less than or equal to 1.0, and the magnitudes of the programming voltages for programming the IGFET can be greater than or equal to 1.5.

A specific example of the method of programming the IGFET may also include applying an initial bias-induced temperature instability stress to the IGFET, such as negative bias temperature instability when the IGFET is an NFET and positive bias temperature instability when the IGFET is a PFET.

DETAILED DESCRIPTION

Embodiments herein provide an alternative electrical fuse having an internal structure similar to or the same as a metal-oxide-semiconductor field effect transistor ("MOSFET") or insulated gate field effect transistor ("IGFET") of the corresponding process technology generation. Such fuse structure, which may replicate the structure of a transistor used in advanced CMOS (complementary metal-oxide-semiconductor) technologies can benefit from being very area efficient and being programmable at relatively low voltages, e.g., from between 1.5 V and 2.5 V. The fuse structure may also be free of additional processing cost, because the same steps used to fabricate the IGFET can be used to fabricate the fuse. The circuit interconnection of the fuse, the programming of the fuse, and its use as a storage element of a memory array are set forth in detail below.

Figure 1:
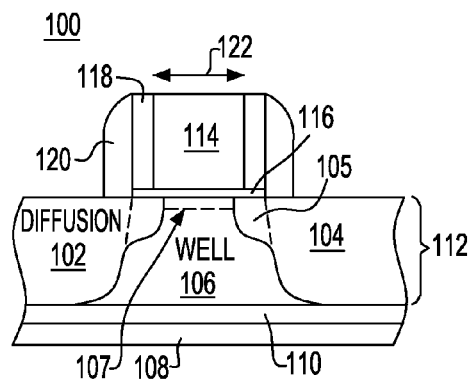
FIG. 1 is a sectional view illustrating a transistor suitable for use as a fuse in accordance with an embodiment of the invention.

FIG. 1 illustrates a fuse in accordance with an embodiment of the invention. The fuse can be implemented by an insulated gate field effect transistor ("IGFET") 100 as seen in FIG. 1. In an example, the IGFET can be as shown in FIG. 1, having a first diffusion region 102 separated from another diffusion region 104 by a well region 106. The diffusion regions 102, 104 can have the same dopant type (i.e., n-type or p-type) and may have the same dopant concentration, which typically is high, such as above $1.0 \times 10^{17}$ cm$^{-3}$. The well 106 can have an opposite dopant type from the dopant type of the diffusion regions 102, 104. The diffusion regions 102, 104 typically serve as a source and a drain of the IGFET, respectively, and are separated from each other by the well region 106, in which a channel region 107 is provided. The IGFET can be an n-channel type IGFET in which the source and drain regions 102, 104 are doped predominantly with an n-type dopant, and the well 106 is doped predominantly with a p-type dopant.

The source and drain regions 102, 104 and the well region 106 can be disposed in a monocrystalline semiconductor region 112 of a substrate, such as a region of monocrystalline silicon, or germanium, for example. Alternatively, the monocrystalline semiconductor region of the substrate can include a compound semiconductor material including one or more compounds of a Group III element of the periodic table of elements with a Group V element thereof, such as gallium arsenide (GaAs) or indium phosphide (InP), for example, or the compound semiconductor material can include one or more compounds of a Group II element of the periodic table of elements with a Group VI element thereof, such as a compound of cadmium with selenium, for example. Alternatively, or in addition thereto, the semiconductor region 112 may include a layer or a feature therein having a semiconductor alloy composition, such as a feature made of silicon germanium, silicon carbon, or other such alloy of silicon with another semiconductor material.

As further seen in FIG. 1, in a particular implementation, the substrate may further include a buried dielectric layer 110 such as a layer of silicon dioxide, which in some cases may separate the monocrystalline region 112 from another region 108 of the substrate. Region 108, if present, typically consists essentially of a semiconductor material which can be monocrystalline, polycrystalline or amorphous in form.

As further seen in FIG. 1, the source and drain regions 102, 104 of the IGFET typically include extension regions 105 which are part of the source and drain regions, and can be referred to as lightly doped drain ("LDD") extensions. The extension regions can be provided in one or both of the source and the drain. Alternatively, the extension regions may be omitted. A gate 114 overlies the channel region 107 and is separated therefrom by a gate dielectric layer 116. The edges of the gate can be insulated by dielectric spacers, which as shown in FIG. 1 can include first spacers 118, typically formed of silicon dioxide by oxidation of silicon or deposited, and second spacers 120 overlying the first spacers, the second spacers being typically formed of silicon nitride. However, in some cases, the first spacers 118 can be omitted. Any suitable spacer of combination of spacers and spacer dielectric materials can be used.

When a sufficiently high bias is applied to the gate of the transistor 100, an inversion layer will form within the channel 107, as indicated by the dashed line extending between the source 102 and the drain 104. The inversion layer, which typically extends between adjacent edges of the source 102 and drain 104 when the transistor is biased with a sufficient voltage between the gate and the source (hereinafter, the "gate-source voltage"), allows current to flow between the source and the drain when a voltage is applied between the drain and the source (hereinafter, the "drain-source voltage"). In transistors according to advanced semiconductor technology of the present, the dimension 122 of the gate as shown in FIG. 1 in a direction of the length of the channel 107 can be on the order of 20 to 40 nanometers. In such transistor, typical operating ranges for the gate-source voltage and the drain-source voltage of the transistor can be between 0.6 and 1.2 volts in magnitude.

When voltages are applied to the transistor 100 in a manner as described below, the transistor can be made to operate as an electrically-blowable fuse in which the operation of "blowing", i.e., programming the fuse causes the resistance between the source and drain of the transistor to increase from a pre-programming value to a post-programming value by two or more orders of magnitude when any combination of any given gate-source voltage value and any given drain-source voltage within normal operating ranges of the transistor 100, e.g., 0.0 to 1.5 V, are applied to the transistor 100. Thus, for example, the gate-source voltage and drain-source voltage applied to the transistor can be at subthreshold levels, or in linear voltage ranges, or can be sufficient to bias the transistor into deep saturation had the transistor not been programmed.

Figure 2:
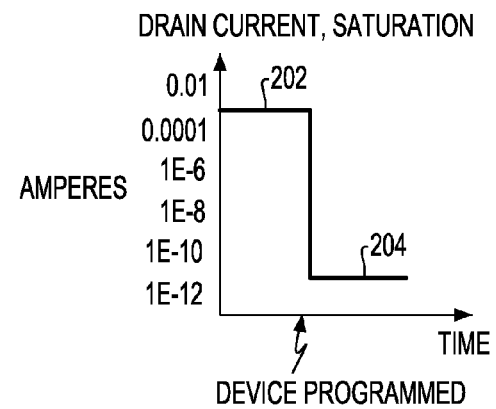
FIG. 2 is a diagram illustrating a change in saturation current carried by a transistor in accordance with a method of programming the transistor according to an embodiment of the invention.

FIG. 2 illustrates a change in the current conducted by the fuse implemented by transistor 100 when the fuse is programmed at a time $t_0$. Referring to FIG. 2, before the fuse is programmed at time $t_0$, the resistance can be detected by an appropriate circuit under a particular biasing condition, for example, for operating the transistor in linear or saturation mode. Specifically an appropriate gate-source voltage beyond the threshold voltage of the transistor and an appropriate drain-source voltage can be applied to the transistor such that the amount of current flowing between the source and drain of the transistor increases linearly with the drain-source voltage when it is low (0.0 to 0.2 V) or reaches a level which is essentially independent of changes in the drain-source voltage when it is high (e.g., from about 0.4 V to 1.2 V). Specifically, when the transistor is in saturation, so long as the gate-source voltage and the drain-source voltage are beyond the threshold voltage of the transistor, the amount of current flowing between the drain and the source of the transistor becomes constant for any given drain-source voltage. FIG. 2 reflects the amount of conducting current 202 between source and drain in linear or saturation modes at a time prior to the transistor being programmed at time $t_0$. As seen in FIG. 2, the current 202 is in a range of the order of 0.0001-0.001 amperes, i.e., of the order of 0.1-1.0 milliamperes.

Then, as further illustrated in FIG. 2, at time $t_o$ the transistor is programmed like a fuse by electrical biasing conditions which permanently alter the electrical characteristics of the transistor. Specifically, the transistor is programmed, i.e., permanently altered, from a first condition to a second condition in which the transistor no longer conducts a comparable amount of current when the same biasing conditions are applied to the transistor. For example, after programming, the transistor may conduct an amount of current 204 between the source and the drain which is two orders of magnitude lower than the amount of current the transistor could conduct prior to programming at any given operating condition, such as when the same gate-source voltage value and the same drain-source voltage value are applied to the transistor. In a particular example such as illustrated in FIG. 2, the amount of current 204 that the programmed transistor is capable of conducting under biasing conditions which, before programming, would be sufficient to operate the transistor in saturation, falls by several orders of magnitude. Specifically, as seen in FIG. 2, for the same gate-source voltage value and drain-source voltage value applied to the transistor, the amount of current falls from a first amount on the order of 0.001 amperes to a second amount of around $1 \times 10^{11}$ amperes (shown on the scale of FIG. 2 as 1E-11 amperes). Thus, in this example, the amount of current that the transistor can carry after programming drops by eight orders of magnitude, when the same biasing voltages are applied thereto as can be used to operate the transistor in saturation prior to programming.

Figure 3:
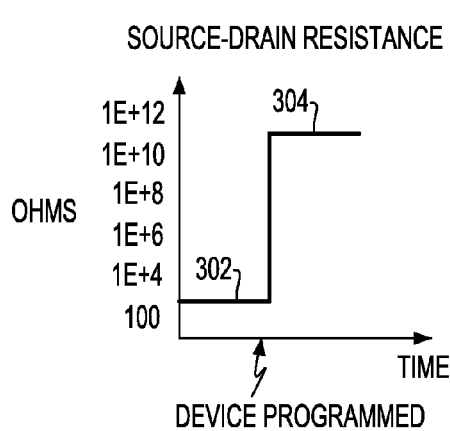
FIG. 3 is a diagram illustrating a change in resistance of a transistor in accordance with a method of programming the transistor according to an embodiment of the invention.

Referring to FIG. 3, the relationship between the pre- and post-programming current carried by the transistor under the same bias voltages applied thereto translates to an equivalent relationship between the pre- and post-programming source-drain resistance of the transistor for the same bias voltages applied to the transistor. Resistance between any two nodes of a circuit is inversely proportional to current according to the equation:

$$R_i = V_i/I_i,$$

where $R_i$ is the instantaneous resistance, $V_i$ is the instantaneous voltage and $I_i$ is the instantaneous current at any point in time for given biasing conditions. Therefore, programming the transistor causes the drain to source current flowing through the transistor for given voltage bias conditions applied to the gate, source and drain of the transistor to decrease by two orders of magnitude, then the resistance of the transistor under the same given voltage bias conditions increases from an initial pre-programming value to a post-programming value which is greater than the pre-programming resistance by two orders of magnitude. Thus, in one example, as seen in FIG. 3, an initial resistance value 302 of the transistor can be 1000 ohms when the transistor is biased in saturation by an appropriate gate-source voltage and an appropriate drain-source voltage. After programming, the same transistor may have a post-programming resistance value which increases by two orders of magnitude to $1 \times 10^5$ ohms (represented in FIG. 3 as "1E5") when the same gate-source voltage and drain-source voltage are applied to the transistor as were used to bias the pre-programmed transistor in saturation.

Similarly, when the drain to source current for given voltage bias conditions prior to programming the transistor decreases by eight orders of magnitude from a pre-programming value to a post-programming value for the same voltage bias conditions, under such conditions the resistance increases correspondingly by eight orders of magnitude. Thus, in the particular example illustrated in FIG. 3, the resistance increases by eight orders of magnitude from the initial pre-programmed resistance value of 1000 ohms to a post-programmed resistance value of $1 \times 10^{11}$ ohms (represented in FIG. 3 as "1E+11").

Figure 4:
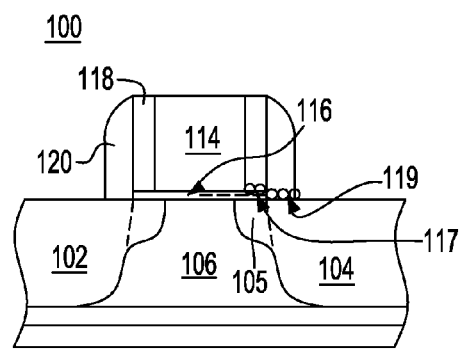
FIG. 4 is a sectional view illustrating a change in a structure of a transistor as a result of programming the fuse in accordance with an embodiment of the invention.

Referring to FIG. 4, the structure of the transistor 100 changes as a result of programming the transistor. A circuit can program the transistor by applying a gate-source voltage and a drain-source voltage to the transistor at levels which are more than 50% greater in magnitude than the gate-source voltage and drain-source voltage used in normal operation of the transistor. Typically, the magnitudes of the gate-source voltage and drain-source voltage used in programming the fuse transistor are between 50 and 150% of the magnitudes of the voltages used in normal operation of such transistor. For example, when the fuse transistor is an n-type FET or "NFET", the gate-source voltage, the gate-source and drain-source voltages used for programming can be 50 to 150% greater than the supply voltage level used in normal operation of the transistor. Applying bias voltages to the transistor at these programming levels creates energetic hot carriers, which in turn creates an avalanche of additional carriers injected into the interface and gate dielectric of the transistor at locations 116, 117, and 119 underneath the gate 114 or under one or more dielectric spacers 118, 120, which may overlie the drain 104 of the transistor, including extension 105. The injection of these energetic carriers cause charged interface states and trapped charges in the above locations which depletes the drain region 104 and shields the channel from the influence of gate bias. The higher the bias voltages and the longer they are applied to the transistor, more interface damage and trapped charges will be created. Bias voltages maintained at the programming levels long enough, e.g., from 10 to 500 milliseconds, for example, are able to create a sufficiently large number of the interface states and trapped charges to program the transistor. Specifically, the interface states and trapped charges caused by programming produce: 1) severe depletion of drain region, such that the drain becomes electrically isolated; and 2) complete shielding of the channel at the drain end from the influence of gate bias, rendering the transistor effectively inoperative thereafter. After programming the transistor in this manner, bias voltages having nominal levels for operating the transistor are no longer capable of inducing a conduction channel in the well region 106 of the transistor. In this way, the drain-source resistance of the transistor increases by several orders of magnitude, as described above.

Figure 5:
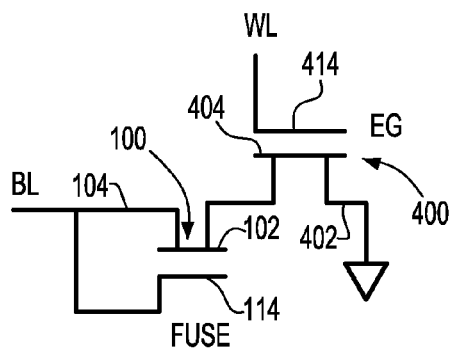
FIG. 5 is a diagram illustrating an interconnection arrangement of a transistor usable as a fuse in accordance with an embodiment of the invention.

FIG. 5 illustrates an interconnection arrangement for programming a transistor 100 used as a fuse in accordance with an embodiment of the invention. In the example illustrated in FIG. 5, the fuse transistor is an NFET 100 in which the gate 114 of the transistor 100 is tied to a bitline BL, such that the bitline voltage is the same on the gate 114 as it is on the drain 104 of the transistor. The source 102 of the transistor is tied to the drain 402 of a second transistor 400 whose source 402 is tied to ground. The second transistor 400 can be referred to as a "programming transistor." The second transistor 400 can be a DG (dural gate) transistor, having an enhanced gate dielectric with increased thickness for withstanding higher voltages, for example. Such enhanced gate dielectric thickness can make the transistor more durable for higher stress conditions. A wordline WL operates the second transistor 400 via a gate 414 to which it is connected. The step of programming applies an elevated gate-source voltage and an elevated drain-source voltage to the NFET.

Figure 6:
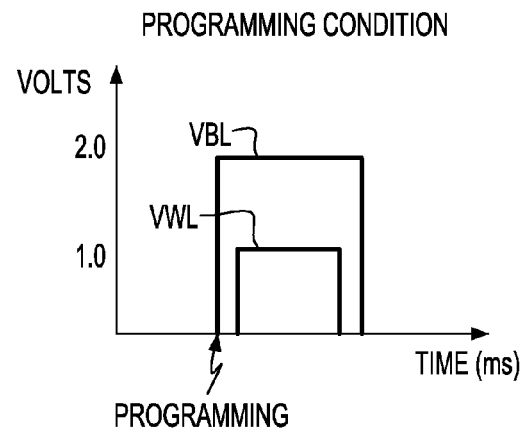
FIG. 6 is a graph illustrating application of voltage levels to a transistor usable as a fuse in a method of programming the transistor in accordance with an embodiment of the invention.

Thus, as seen in FIG. 6, programming of the transistor 100 can begin by elevating the voltage on the bitline VBL to a sufficient level such as 2.0 volts. This raises the voltages on the drain 104 and the gate 114 of the transistor 100 to 2.0 volts. However, to program the fuse transistor 100, the voltage on the source 102 of the transistor must also be controlled so that each of the gate to source voltage and the drain to source voltage of transistor 100 can be elevated to sufficient levels to program the transistor. To control the voltage on the source 102 of the transistor, a driver (not shown) typically on the same chip as the second transistor 400 raises the voltage on the wordline VWL to a level which turns on the second transistor 400. VBL may be elevated prior to elevating VWL, as seen in FIG. 6, or after elevating VWL, or the two voltages may be elevated to programming voltage levels at the same time. In one example, there may only be a small amount of time between the time that VBL is elevated to the programming voltage level and the time at which VWL is elevated. For example, there may only be a few nanoseconds between the time that VBL is elevated to the programming voltage level and the time at which VWL is elevated.

Turning on the second transistor 400 couples the source 102 of the transistor to ground, thereby reducing the voltage on the source 102 to ground. When both VBL and VWL are active, the gate-source voltage and the drain-source voltage on transistor 100 are each at least 50% greater than the nominal high voltage used for normal operation of the transistor under conditions without programming the transistor. In one example, the gate-source and drain-source voltages used for programming the NFET are 50-150% of the high voltage level used during normal operation. The elevated voltage on the bitline and the activation voltage on the wordline 414 then are maintained for sufficient time, such as from 10 to 500 milliseconds, for example, to program the transistor 100. As a result, the elevated gate-source voltage and drain-source voltage applied to transistor 100 are sufficient to permanently alter the transistor from the initial unprogrammed state to the programmed state.

An example of a voltage level VBL used to program an NFET fuse transistor 100 ranges from 1.8 to 2.5 V. In one example, the VWL level required to turn on the programming transistor 400 can be from 0.9 V to 1.5 V for an NFET transistor, for example. In one example, gate-source and drain-source voltage levels used to read the state of the fuse transistor 100 normally, i.e., voltages capable of turning the transistor on or off without programming the fuse transistor may range from 0 to 1.0 volts in magnitude. Referring again to FIG. 5, the second transistor 400, the programming transistor, can be designed in a way to withstand the voltage levels applied during the programming of the fuse transistor 100. For example, as indicated above, the programming transistor 400 can have a thicker gate dielectric than the gate dielectric of fuse transistor 100. The thicker gate dielectric can allow the programming transistor to operate at a gate to source voltage of up to 1.5 V and to withstand gate-source and drain-source voltages of 2.5 V which will be present during programming between the gate 414 and the source 402 of transistor 400 and between the drain 404 and the source 402 of transistor 400.

Figure 7:
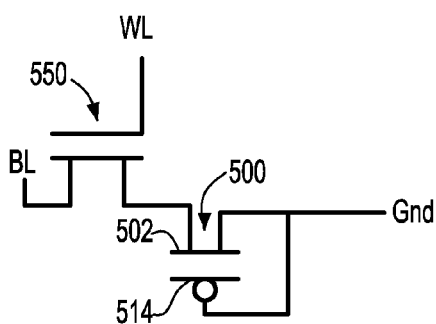
FIG. 7 is a diagram illustrating an interconnection arrangement of a p-channel type transistor usable as a fuse in accordance with an embodiment of the invention.
Figure 8:
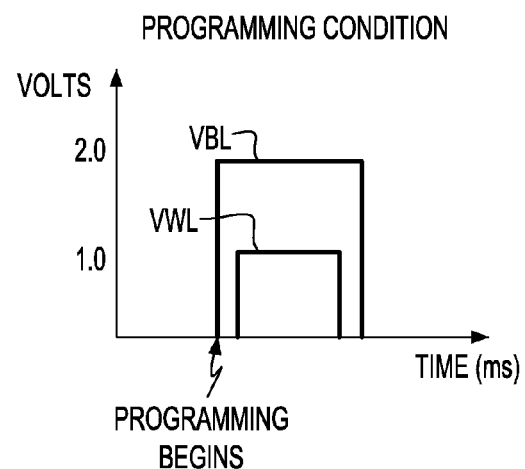
FIG. 8 is a graph illustrating application of voltage levels to a p-channel type transistor usable as a fuse in a method of programming the transistor in accordance with an embodiment of the invention.

In another example (FIG. 7), the fuse transistor can be a p-channel type FET ("PFET") having a gate 514 and a drain tied to ground. In this case, the fuse transistor and the programming transistor switch position as shown in the figure. Then, the voltage VBL on the bitline can be elevated from 0 V to about 2.0 V, and the voltage VWL on the wordline can be elevated from 0 V to a voltage between 0.9 and 1.5 V. Under such conditions, the second transistor 550 turns on and electrically connects the source 502 of the fuse PFET 500 with the bitline and passes the bitline voltage level (VBL) to the source 502 of the fuse PFET 500. In this way, a drain-source voltage of −2.0 V and a gate to source voltage of −2.0 V can be applied to the PFET fuse 500 to program the fuse 500. The time needed to program the fuse 500, i.e., to maintain these voltages on the PFET fuse 500 is about the same as for the case of the NFET fuse 100, i.e., 10 to 500 milliseconds.

Figure 9:
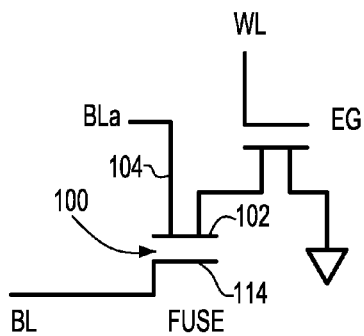
FIG. 9 is a diagram illustrating an interconnection arrangement of a transistor usable as a fuse in accordance with a variation of the embodiment shown in FIG. 5.
Figure 10:
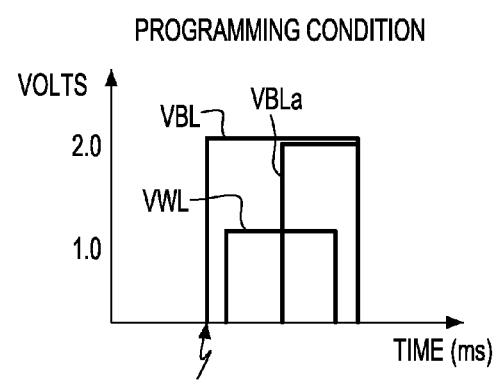
FIG. 10 is a graph illustrating application of voltage levels to a transistor usable as a fuse in a method of programming the transistor in accordance with the variation shown in FIG. 9.

The above transistor fuses and methods of programming them may be further enhanced as seen in FIGS. 9 and 10. FIG. 9 illustrates an interconnection arrangement of the transistor fuse 100 in which the voltages applied to the gate 114 and the drain of the transistor can be different. Specifically, a voltage VBL from a bitline BL can be applied to the gate 114 of the fuse 100 and a different voltage VBLa from a second bitline BLa can be applied to the drain 104 of the transistor 100. Then, as illustrated in FIG. 10, the voltage VBL on the bitline BL can be elevated at a different time from that at which the voltage VBLa on bitline BLa is elevated. The wordline voltage VWL can be elevated at the same time or slightly before or after VBL is elevated in order to apply an elevated gate-source voltage to the transistor fuse 100. At some time after elevating VBL and VWL, the voltage level VBLa on the second bitline BLa can be elevated to the same level as VBL from ground. Programming then continues with VWL, VBL and VBLa at the elevated levels.

The variation of programming operations described relative to FIGS. 9 and 10 above involves the use of negative bias temperature instability ("NBTI") mechanism in the case of a PFET fuse and positive bias temperature instability ("PBTI") mechanism in the case of an NFET fuse. These mechanisms are responsible for transistor degradation, i.e., changes in the operating characteristics, e.g., the drive current, threshold voltage, off-current, etc., of transistors after the transistor has been in use for a long period of time. In this case, these mechanisms are deliberately utilized to assist in performing the function needed, that of programming a fuse transistor in order to permanently increase the on-resistance of the fuse transistor to a level several orders of magnitude higher than the fuse transistor's on-resistance prior to programming.

Figure 11:
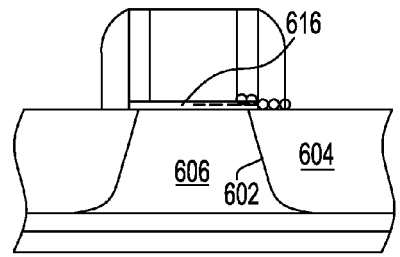
FIG. 11 is a sectional view of a transistor usable as a fuse in accordance with a variation of the embodiment described above with reference to FIG. 1.
Figure 12:
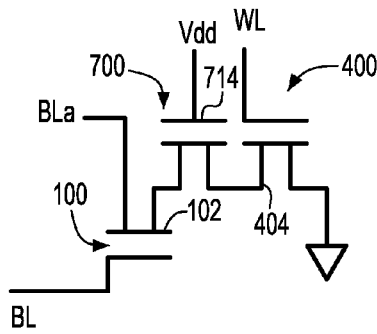
FIG. 12 is a diagram illustrating an interconnection arrangement of a transistor usable as a fuse in accordance with a variation of the embodiment of FIG. 9.

Further variations can be made to the structure of transistor fuse 100 to ensure that relatively low programming voltages such as described above can cause an increase in the resistance of the transistor fuse by two or more orders of magnitude. For example, as seen in FIG. 11, the lightly doped drain ("LDD") extensions can be omitted, which will then provide a more abrupt junction 602 between the well 606 and the drain 604 of the transistor, and more easily achieve hot carrier injection into the gate dielectric and spacer dielectric 616 as described above through the enhanced electric field at the drain junction. Other variations which can also contribute to programming the transistor at relatively low programming voltages to increase resistance by two or more orders of magnitude can be to fabricate the transistor to have a relatively low threshold voltage such as a voltage between 0.1 V and 0.3V, for example, or to design the fuse transistor deliberately to have a shorter channel, such as a transistor having an initial channel length of 20 to 30 nanometers when the channel length of other transistors used on the chip have a minimum channel length of 30 to 40 nanometers. Short channel length can be achieved, for example, by performing the ion implants to form the source and drain regions 102, 104 (FIG. 1) of the transistor fuse 100 prior to forming the spacers 118, 120. FIG. 12 illustrates a further interconnection arrangement of the transistor fuse 100 according to a variation of the embodiment described above relative to FIG. 9. As seen in FIG. 12, an additional transistor 700 is disposed between the fuse transistor 100 and the programming transistor. As seen in FIG. 12, the additional transistor 700 can be an n-channel type FET or NFET. The NFET 700, having a gate 714 tied to Vdd, is biased to electrically connect the source 102 of the fuse transistor 100 to the drain of the programming transistor 400. Such arrangement as in FIG. 12 can help to reduce electrical stress on the programming transistor 400 during programming. In addition, the arrangement shown in FIG. 12 can help reduce electrical stress during programming on fuse transistors which are not currently being programmed but which nevertheless can be on the same bitline as a transistor fuse currently being programmed. The reduction in electrical stresses applied to the fuse transistors and the programming transistors can allow the thickness of the gate dielectric layer used in the programming transistor 400 and the additional transistor 700 to be reduced. In one example, the thickness of the gate dielectric of the programming transistor 400 and the additional transistor 700 can be the same thickness as that of the fuse transistor and other transistors on the same semiconductor chip. In this way, fabrication of the transistors, fuse transistor, and programming transistor on the same chip can be done by making a gate dielectric layer having the same thickness for all of the aforementioned transistors.

Figure 13:
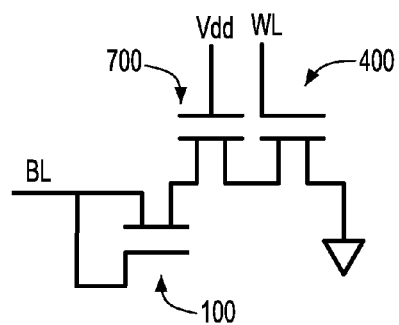
FIG. 13 is a diagram illustrating an interconnection arrangement of a transistor usable as a fuse in accordance with a variation of the embodiment of FIG. 5.

FIG. 13 illustrates a further variation, similar to that shown in FIG. 12, but in which the gate and the drain of the fuse transistor are tied together, similar to the embodiment described above relative to FIG. 5. As in the FIG. 12 embodiment, the thickness of the gate dielectric of the programming transistor 400 can be reduced to that used in other transistors such as the fuse transistor or the additional transistor. Here again, the additional transistor 700 in FIG. 13, can help reduce electrical stresses on the programming transistor 400 during programming. As described above (FIG. 12), the additional transistor can also reduce electrical stresses during programming on fuse transistors which are not currently being programmed but which nevertheless may be on the same bitline as a transistor fuse currently being programmed.

Figure 14:
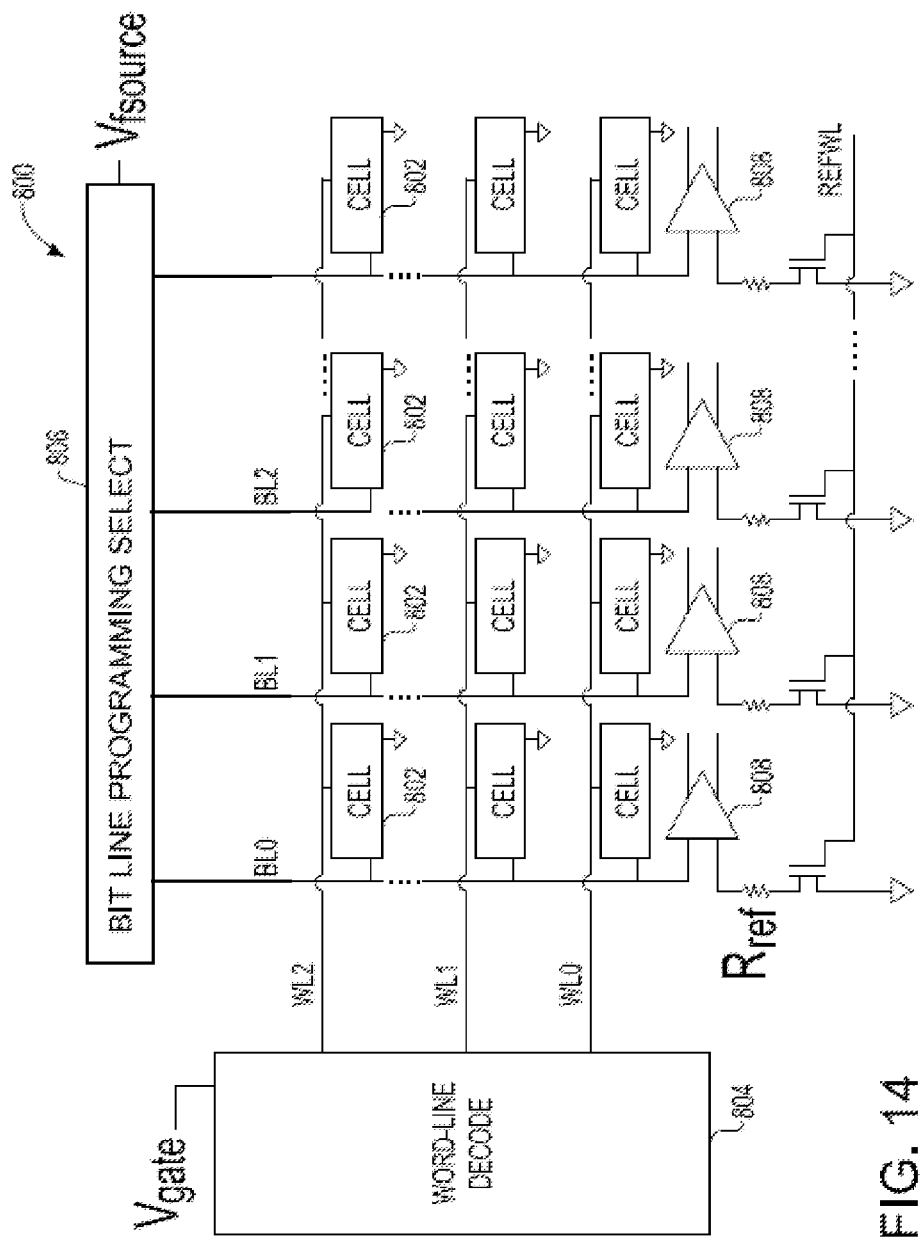
FIG. 14 is a diagram illustrating a memory array including a plurality of memory cells each containing at least one transistor operable as a fuse in accordance with an embodiment of the invention.

FIG. 14 illustrates a memory array 800 implemented using an array including a plurality of memory cells 802, each containing a transistor fuse 100 as described in the foregoing with respect to one or more of FIGS. 1-13. As seen in FIG. 14, a plurality of wordlines, e.g., WL0, WL1, WL2, etc., extend in a first direction across the memory array 800, and a plurality of bitlines, e.g., bitlines BL0, BL1, BL2, etc., extend across the memory array in a second direction transverse to the first direction. The memory array can further include a wordline decode unit 804 whose purpose is to select and activate one or more wordlines of the memory array in accordance with address and control signals (not shown) provided thereto. A power supply input thereto (VWL) receives a power supply voltage level to which a wordline of the memory array is elevated when a particular cell of the memory array is selected.

A bitline programming select unit 806 receives other address or control signals (not shown) and at a controlled time elevates a voltage on one or more bitlines selected in accordance with these address signals. The voltage on the selected bitline can be elevated to a special voltage level VBL for writing a cell coupled to the bitline using a driver controlled by the bitline programming select unit 806. As noted above, the special voltage level VBL used for programming a fuse transistor 100 of a cell 802 can be 2.0 V when the cell has a structure as described with reference to one or more of the foregoing figures.

FIG. 14 further illustrates a series of sensors 808, each of which is coupled to one of the bitlines of the memory array. Sensors 808 detect the polarity of data bits stored in the memory cells which are accessed by a currently activated wordline of the memory array 800. When a cell has not yet been programmed, a current can flow through a memory cell 802 accessed by a particular memory array to ground, such that a sensor 808 detects a low voltage level, or a "0" on the bitline coupled to that particular sensor. Once the cell has been programmed, the fuse transistor in the cell has been blown, and no current can flow therethrough. Therefore, in that case, a sensor 808 detects a high voltage level or a "1" on the bitline coupled to that particular sensor, thus indicating that the fuse transistor has been programmed.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of operating an insulated gate field effect transistor ("IGFET"), comprising:
   programming the IGFET to permanently electrically isolate the drain of the IGFET from the source of the IGFET, such that as a result of the programming, a resistance between the source and the drain increases from a pre-programming value corresponding to a first conducted state of the IGFET to a post-programming value by two or more orders of magnitude when any given gate-source voltage value and any given drain-source voltage value within normal operational ranges of the IGFET are applied thereto.

2. The method of claim 1, wherein the IGFET is an n-channel type field effect transistor ("NFET") embodied in a semiconductor chip having complementary metal-oxide-semiconductor ("CMOS") devices thereon.

3. The method of claim 1, wherein the step of programming the IGFET includes overdriving the gate-source voltage and drain-source voltage of the IGFET.

4. The method of claim 3, wherein the step of programming the IGFET includes applying a drain-source voltage and a gate-source voltage at magnitudes equal to or greater than 1.5 times nominal levels for operating the IGFET in the first conducting state.

5. The method of claim 3, wherein the step of programming the IGFET includes applying the gate-source voltage to the IGFET at a programming level having a magnitude equal to or greater than 1.5 times the nominal level for operating the IGFET in the first conducting state while applying the drain-source voltage to the IGFET at a programming level having a magnitude equal to or greater than 1.5 times the nominal level for operating the IGFET in the first conducting state.

6. The method of claim 5, wherein the step of programming the IGFET includes applying the drain-source voltage and the gate-source voltage to the IGFET at the respective programming levels for 10 to 500 milliseconds.

7. The method of claim 5, wherein the step of programming the IGFET also includes an initial bias-induced temperature instability stress.

8. The method of claim 7, wherein the IGFET is an n-type field effect transistor ("NFET") and the step of programming the IGFET includes applying negative bias temperature instability stress to the NFET.

9. The method of claim 7, wherein the IGFET is a p-type field effect transistor ("PFET") and the step of programming the IGFET includes applying positive bias temperature instability stress to the PFET.

10. The method of claim 3, wherein the IGFET is a first IGFET and a second IGFET has one of a source or a drain electrically connected to one of the source or the drain of the first IGFET, wherein another one of the source or the drain of the first IGFET is electrically connected with the gate of the first IGFET, wherein the step of programming is performed by applying a first voltage simultaneously to the drain and to the gate of the first IGFET.

11. The method of claim 3, wherein the IGFET is a first IGFET and a second IGFET has one of a source or a drain electrically connected to one of the source or the drain of the first IGFET, wherein the step of programming is performed by applying a first voltage to the drain of the first IGFET and applying a second voltage to the gate of the first IGFET.

12. The method of claim 1, wherein the magnitudes of the nominal voltage levels for operating the IGFET in the first conducting state are less than or equal to 1.0, and the magnitudes of the voltages for programming the IGFET can be greater than or equal to 1.5.

13. The method of claim 1, wherein the resistance between the source and drain increases by five or more orders of magnitude.

14. A method of programming a "write once read many" memory cell of an integrated circuit memory array having first and second binary states, comprising:
   programming an insulated gate field effect transistor ("IGFET") of a memory cell of the memory array so as to permanently electrically isolate the drain of the IGFET from the source of the IGFET and permanently alter the IGFET from a first conducting state to a second nonconducting state, such that as a result of the programming, a resistance between the source and the drain increases from a pre-programming value to a post-programming value by two or more orders of magnitude when any given gate-source voltage value and any given drain-source voltage value within normal operational ranges of the IGFET are applied thereto, wherein the first and second states of the IGFET represent the first and second binary states of the memory cell.

15. The method of claim 14, wherein the IGFET is an n-channel type field effect transistor ("NFET") embodied in a semiconductor chip having complementary metal-oxide-semiconductor ("CMOS") devices thereon.

16. A method of programming a "write once read many" memory cell of an integrated circuit memory array having first and second binary states, comprising:
  programming an insulated gate field effect transistor ("IG-FET") of a memory cell of the memory array so as to permanently electrically isolate the drain of the IGFET from the source of the IGFET and permanently alter the IGFET from a first conducting state to a second nonconducting state, such that as a result of the programming, a resistance between the source and the drain increases from a pre-programming value to a post-programming value by two or more orders of magnitude when any given gate-source voltage value and any given drain-source voltage value within normal operational ranges of the IGFET are applied thereto, wherein the first and second states of the IGFET represent the first and second binary states of the memory cell; and
  programming the IGFET by applying an initial bias-induced temperature instability stress to the IGFET.

17. The method of claim 16, wherein the step of programming the IGFET includes overdriving the gate-source voltage and drain-source voltage of the IGFET.

18. The method of claim 17, wherein the step of programming the IGFET includes applying the gate-source voltage to the IGFET at a programming level having a magnitude equal to or greater than 1.5 times the nominal level for operating the IGFET in the first conducting state while applying the drain-source voltage to the IGFET at a programming level equal to or greater than 1.5 times the nominal level for operating the IGFET in the first conducting state.

19. The method of claim 17, wherein the IGFET is a first IGFET and a second IGFET has one of a source or a drain electrically connected to one of the source or the drain of the first IGFET, wherein another one of the source or the drain of the first IGFET is electrically connected with the gate of the first IGFET, wherein the step of programming is performed by applying a first voltage simultaneously to the drain and the gate of the first IGFET.

20. The method of claim 16, wherein the magnitudes of the nominal voltages for operating the IGFET in the first conducting state are less than or equal to 1.0, and the magnitudes of the programming voltages for programming the IGFET are greater than or equal to 1.5.

* * * * *